United States Patent
Xin et al.

(10) Patent No.: US 10,381,397 B2
(45) Date of Patent: Aug. 13, 2019

(54) NANO METALLIC PLANAR APEX OPTICAL DETECTOR

(71) Applicant: Black Sesame Technologies Inc., Santa Clara, CA (US)

(72) Inventors: Zhaowei Xin, Wuhan (CN); Dong Wei, Wuhan (CN)

(73) Assignee: Black Sesame International Holding Limited, Santa Clara, CA (US)

( * ) Notice: Subject to any disclaimer, the term of this patent is extended or adjusted under 35 U.S.C. 154(b) by 0 days.

(21) Appl. No.: 15/926,748

(22) Filed: Mar. 20, 2018

(65) Prior Publication Data
US 2019/0148452 A1   May 16, 2019

Related U.S. Application Data

(60) Provisional application No. 62/586,011, filed on Nov. 14, 2017.

(51) Int. Cl.
| | |
|---|---|
| *H01L 31/0232* | (2014.01) |
| *H01L 27/146* | (2006.01) |
| *H04N 5/33* | (2006.01) |
| *H01L 33/58* | (2010.01) |

(52) U.S. Cl.
CPC .... *H01L 27/14669* (2013.01); *H01L 31/0232* (2013.01); *H04N 5/33* (2013.01); *H01L 27/14627* (2013.01); *H01L 31/02327* (2013.01); *H01L 33/58* (2013.01)

(58) Field of Classification Search
CPC .............. H01L 27/14627; H01L 33/58; H01L 31/02327
USPC ........................................................ 257/432
See application file for complete search history.

(56) References Cited

U.S. PATENT DOCUMENTS

| | | | | |
|---|---|---|---|---|
| 5,973,316 A * | 10/1999 | Ebbesen | ................ | B82Y 20/00 250/216 |
| 6,040,936 A * | 3/2000 | Kim | ...................... | G02B 5/008 359/245 |
| 6,236,033 B1 * | 5/2001 | Ebbesen | ................ | B82Y 20/00 250/216 |
| 6,441,945 B1 * | 8/2002 | Atwater | ................... | B82B 1/00 204/450 |
| 8,094,394 B2 * | 1/2012 | Yamada | ................. | G02B 5/008 359/241 |
| 9,368,667 B1 * | 6/2016 | Kim | ................ | H01L 31/02327 |
| 9,464,985 B2 * | 10/2016 | Liu | ........... | G01N 21/41 |
| 2006/0274315 A1 * | 12/2006 | Saito | .................... | G01N 21/554 356/445 |
| 2007/0096087 A1 * | 5/2007 | Catrysse | ................ | B82Y 20/00 257/40 |
| 2009/0261250 A1 * | 10/2009 | Zhou | .................. | G01B 11/2441 250/307 |
| 2009/0296246 A1 * | 12/2009 | Yamada | ................. | B82Y 20/00 359/885 |
| 2013/0134309 A1 * | 5/2013 | Rapaport | ............. | G02F 1/3556 250/330 |

(Continued)

*Primary Examiner* — George R Fourson, III
(74) *Attorney, Agent, or Firm* — Timothy T. Wang; Ni, Wang & Massand, PLLC

(57) ABSTRACT

A nano-metallic-planar-apex optical detector, comprising a semiconductor optical detector and a nano array mask defining a plurality of polygonal apertures connected to the optical detector, wherein the semiconductor optical detector detects near-field light focused b the nano array.

19 Claims, 3 Drawing Sheets

(56) References Cited

U.S. PATENT DOCUMENTS

| | | | |
|---|---|---|---|
| 2013/0181129 A1* | 7/2013 | Berte | G01J 5/0007 |
| | | | 250/332 |
| 2013/0192226 A1* | 8/2013 | Stettenheim | F03G 6/06 |
| | | | 60/641.15 |
| 2014/0168651 A1* | 6/2014 | Guo | G01N 21/554 |
| | | | 356/445 |
| 2014/0191113 A1* | 7/2014 | Atwater | H01L 27/14621 |
| | | | 250/208.1 |
| 2014/0291479 A1* | 10/2014 | Lu | H01L 31/035218 |
| | | | 250/200 |
| 2015/0036234 A1* | 2/2015 | Ben-Yakar | G02B 5/206 |
| | | | 359/885 |
| 2015/0284852 A1* | 10/2015 | Pokroy | C23C 14/18 |
| | | | 428/546 |
| 2016/0343887 A1* | 11/2016 | Hossain | H01L 31/02366 |
| 2016/0357026 A1* | 12/2016 | Astratov | G01N 21/01 |
| 2017/0102617 A1* | 4/2017 | Fischer | G03F 7/2047 |
| 2017/0201658 A1* | 7/2017 | Rosenblatt | G02B 1/007 |
| 2017/0293053 A1* | 10/2017 | Cheatham, III | G02B 5/008 |
| 2018/0106933 A1* | 4/2018 | Chanda | G02B 5/12 |

\* cited by examiner

NANO METALLIC PLANAR APEX OPTICAL DETECTOR

BACKGROUND

(1) Technical Field

The instant disclosure pertains to optical defectors, specifically nano-metallic-planar-apex metamaterial infrared detectors.

(2) Background

Currently silicon based infrared detectors are inefficient because the energy of the infrared incident photons is less than that which causes electron excitation from the valence to the conduction band. Currently detectors for the infrared region are built on substrates of Indium Gallium Arsenide (InGaAs) or Germanium (Ga), which have a lower energy bandgap. InGaAs and Ga infrared optical detectors may be difficult to fabricate and may be expensive.

Several approaches to detect infrared light in silicon have been demonstrated over the years, for example, solid-state thin film for infrared-to-visible up-conversion employing lead sulphide colloidal nanocrystals as a sensitizer, pyramidally shaped plasmonic concentrator Schottky detectors, and nonlinear processes such as two-photon absorption.

What is sought is a device capable of efficiently detecting photons in the optical and near-infrared spectral regions. A device utilizing nanoscale arrays may provide a solution to efficient detection of infrared photons utilizing a silicon substrate.

SUMMARY OF THE INVENTION

In one embodiment a nano-metallic-planar-apex optical detector, comprising a semiconductor optical detector and a nano array mask defining a plurality of polygonal apertures connected to the optical detector, wherein the semiconductor optical detector detects near-field light focused by the nano array.

In a further embodiment a nano-metallic-planar-apex optical detector, comprising a nano array mask defining a plurality of polygonal apertures that form a plurality of Schottky contact electrodes, a semiconductor optical detector, having a semiconductor optical detector first side connected to the plurality of Schottky contact electrodes wherein the semiconductor optical detector detects near-field light focused by the array, the semiconductor optical detector having a semiconductor optical detector second side opposite the semiconductor optical detector first side and a plurality of ohmic contact electrodes aligned with the nano array and connected to the semiconductor optical detector second side.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
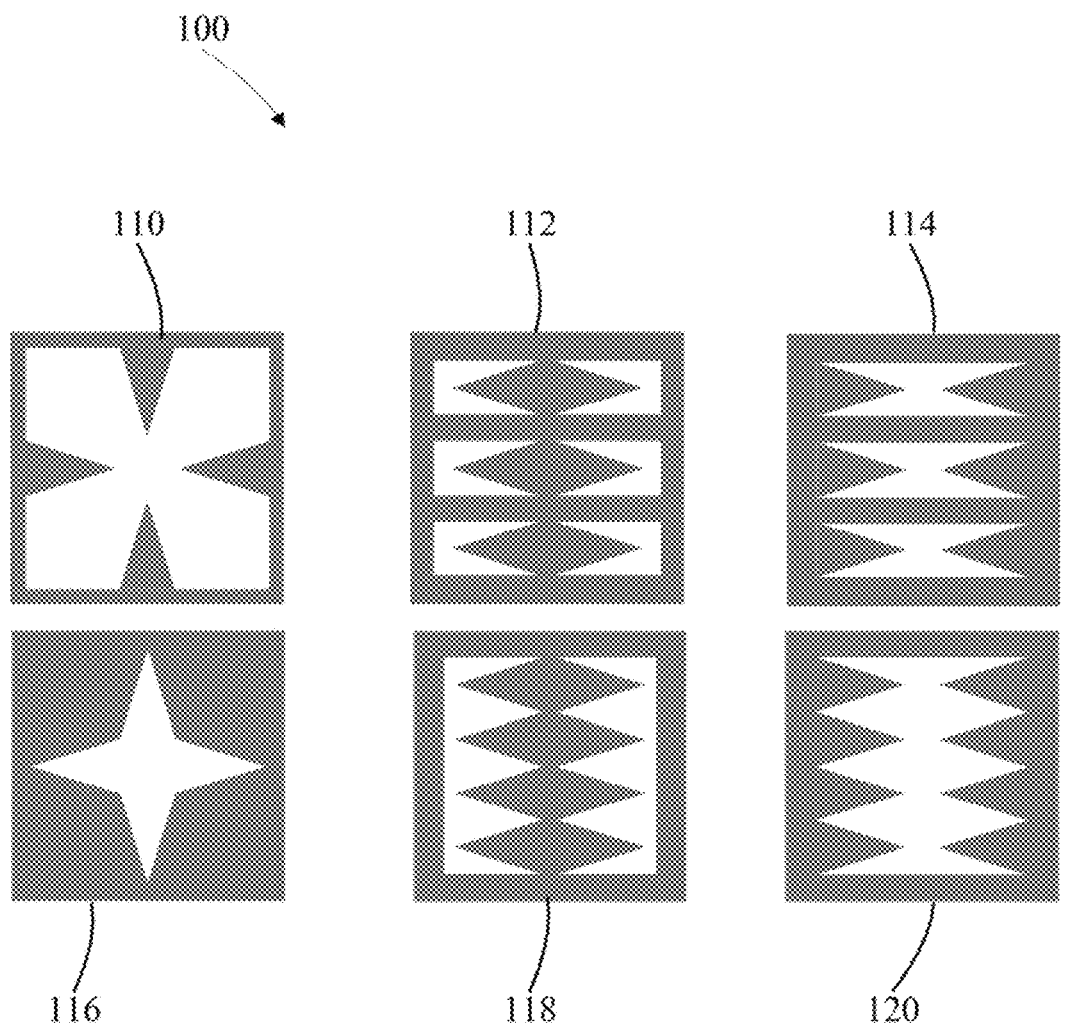
FIG. 1 is the first illustrative drawing of nano-metallic-planar-apex arrays in accordance with at least one embodiment of the disclosure.

The disclosure describes an optical concentrator is shown utilizing a nano-focusing effect of incident light based on surface plasmon polartons (SPPs) on nano-metallic-planar-apex metamaterials (NMPAM). The NMPAM may be used to enhance the strength of the surface evanescent and excitation of several SPP modes on the metal surface. The interaction of different SPPs result in unique near-field optical properties for imaging and optical storage, so as to focus light into a nano-size point and thus enhance the light power. The NMPAM may be utilized for coupling with infrared pixels to enhance the incident light converging so as to improve signal to noise ratio of infrared detection.

A new way to detect infrared light using a silicon substrate is shown by utilizing nano-metallic-planar-apex metamaterials (NMPAM). The NMPAM comprises a silicon substrate and a gold film with nano-planar-apex apertures. The silicon substrate shares a common interface with the gold and a Schottky barrier is created. The energy barrier height is thus lowered to a point lower than the energy barrier height of silicon, and lower than infrared photons.

Illuminated by infrared light, electrons on the old film may cross over the Schottky barrier into silicon. When under a reverse bias, they are collected as a photocurrent. The NMPAM is used to focus the incident light into ~100 nm-scale and consequently enhance the electric power and improve the signal to noise ratio.

The concentration of the optical energy into nanoscale structures and enhancement of optical fields within nanoscale spatial regions is achieved using a lightning-rod effect. The lightning-rod effect is a broadband phenomenon that involves the enhancement of a local near field as a consequence of the high local charge densities present near the sharp metal tip. The non-resonant interaction of incident light with metallic nanostructures leads to enhancement of the near field on the planar apex, which may be detected by the common silicon photodetectors.

The gold planar apexes perform efficiently as broadband light concentrators, collecting light from a large area into a small active pixel area, thus providing high responsivity with low dark current.

In one example a detector was fabricated on a single side polished 2-inch p-type 350 μm thick silicon wafer with {111} crystallographic plane orientation. A five (5) nanometer layer of Cadmium (Ca) was deposited as an adhesion layer on the silicon substrate and a one hundred (100) nanometer gold layer was then sputtered on the Cadmium. Mask patterns were defined by Focused Ion Beam (FIB).

With respect to the polarization of incoming light, it was found that when the polarization is parallel to an apex direction of the mask that the light is concentrated to the tip of the mask aperture. When the polarization is perpendicular to the apex direction of the mask aperture, the light concentrated to the basic angles of the aperture and concentrated to the tip. Thus it was found that the NMPAM structure results in polarization independence.

It was found that when the NMPAM sample illuminated by light, the interaction of light and the mask gives rise to the collective oscillation of free-electrons on the metal surface. The free-electrons oscillated along the direction of the electromagnetic radiation and that the oscillation direction is parallel with the polarization.

As the oscillation wave spreads to the tip of the mask aperture, the oscillation of the free electron at the apex may be enhanced. For the light-bar effect, the concentration of the free-electron is strong, because the oscillation at the apex is enhanced; the intensity of near-field light may be enhanced. As the result of the lightning-rod effect, the density of the electrical field at the apex is high. As the same time, the large charge density and the oscillation enhance the apex near-field light.

Random polarization vectors of light may be resolved into x-component and y-components. The x-polarization light may give rise to the oscillation of free-electrons at transverse double-apex surfaces, the y-polarization light may result in oscillation of free-electrons at longitudinal double-apex surfaces. So, the NMPAM may be polarization independent, and function independently of the polarization of incoming light.

In the instant disclosure a simple design of a nano-focusing plasmonic metamaterials exhibiting spectrally near-field converge effect is described. The NMPAM may be applied to infrared detectors to improve the signal to noise ratio.

FIG. 1 shows an example design of nano-metallic-planar-apex arrays for nanofocusing of light and electron convergence. Element 110 has the nano array mask defining a box aperture having four isosceles triangular inserts along the inside edges of the box. Element 112 has the nano array mask defining three box apertures having a rhombus insert in each box. Element 114 shows the nano array mask defining three box apertures bow tie apertures within the boxes and multiple bow tie apertures the inside edges of the box. Element 116, shows the nano array mask defining at least one isotoxal square star aperture. Element 118 shows the nano array mask defining a box aperture having multiple rhombus inserts within the box. Element 120 shows the nano array mask defining a box aperture having multiple isosceles triangular inserts remaining along two inside edges of the box and triangular metal remaining along two inside edges of the box.

Figure 2:
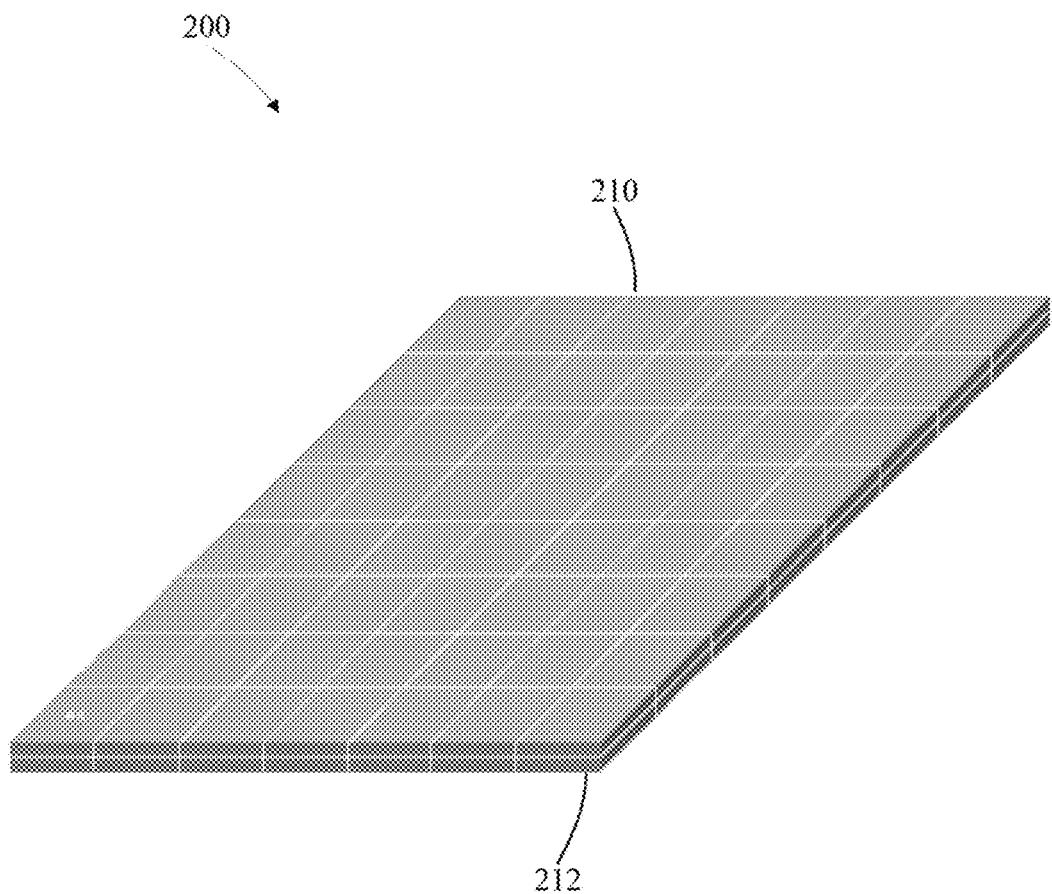
FIG. 2 is the second illustrative drawing of a nano-metallic-planar-apex array optical detector in accordance with one embodiment of the disclosure.

FIG. 2 illustrates an example design of a first detector. The nano-metallic-planar-apex arrays 210 are affixed directly to a detector 212. The detector detects near-field light which is nano focused by the nano-metallic-planar-apex arrays.

Figure 3:
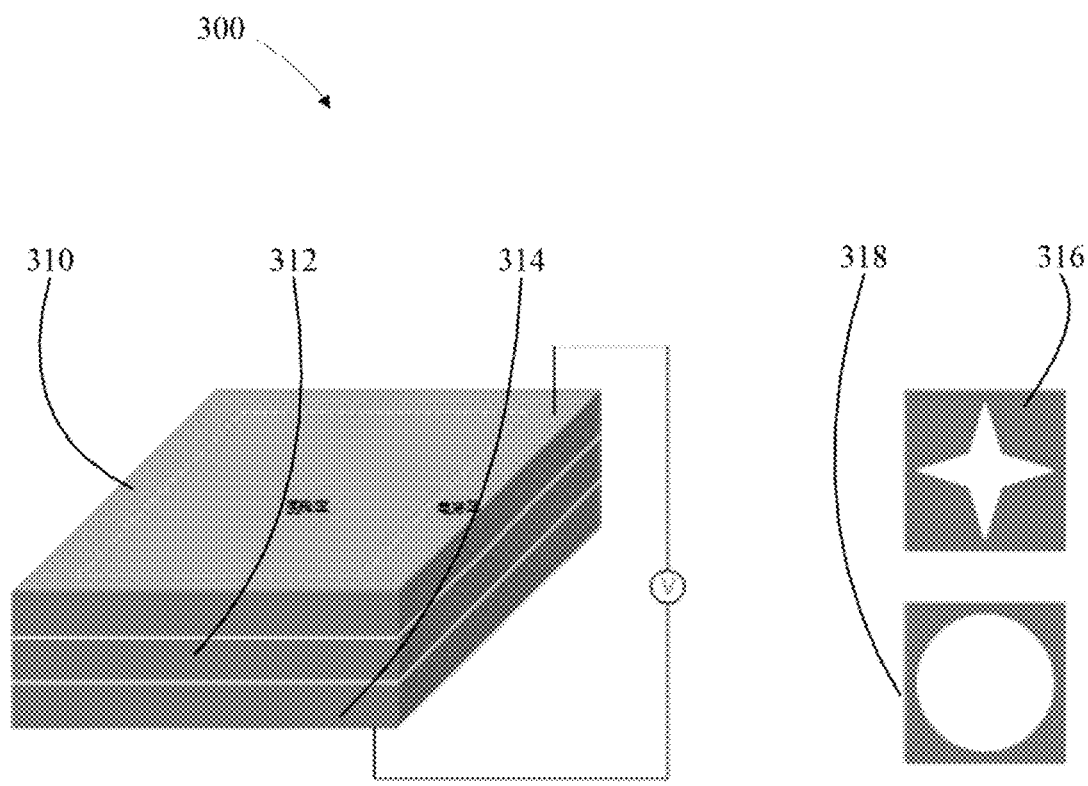
FIG. 3 is the third illustrative drawing of a nano-metallic-planar-apex array optical detector in accordance with one embodiment of the disclosure.

FIG. 3 illustrates an example design of a second detector. The top layer is a Schottky contact electrode 310, which is the metallic film with nano-planar-apex structure 316 in FIG. 1, the middle layer is a semiconductor 312 that acts as an optical detector and the bottom layer 314 is an ohmic contact electrode 318. There is a hole in the middle that allows incident light shines directly on the semiconductor. Different incidental lights will produce different photocurrents when voltage is applied. The Schottky contact electrodes are used to concentrate electrons and improve the signal-to-noise ratio.

It is to be understood that various modifications may be made without departing from the spirit and scope of the invention. It is to be understood that the foregoing description is intended to illustrate and not to limit the scope of the invention, which is defined by the scope of the following claims, and that other embodiments are within the scope of the claims.

What is claimed is:

1. A nano-metallic-planar-apex optical detector, comprising:
   a semiconductor optical detector; and
   a nano array mask defining a plurality of polygonal apertures connected to the optical detector,
   wherein the semiconductor optical detector detects near-field light focused by the nano array; and
   wherein the nano array mask comprises a cadmium adhesion layer and a gold layer.

2. Wherein the nano-metallic-planar-apex optical detector of claim 1 wherein the nano array mask defining at least one box aperture having at least one isosceles triangular insert remaining along at least one edge of an inside of the at least one box aperture.

3. Wherein the nano-metallic-planar-apex optical detector of claim 1 wherein the nano array mask defining at least one isotoxal square star aperture.

4. Wherein the nano-metallic-planar-apex optical detector of claim 1 wherein the nano array mask defining at least one box aperture having at least one rhombus insert remaining within the at least one box aperture.

5. Wherein the nano-metallic-planar-apex optical detector of claim 1 wherein the nano array mask defining at least one box aperture having a plurality of rhombus inserts remaining within the at least one box aperture.

6. Wherein the nano-metallic-planar-apex optical detector of claim 1 wherein the nano array mask defining at least one box aperture having at least one bow tie aperture along at least one inside edge of the at least one box aperture.

7. Wherein the nano-metallic-planar-apex optical detector of claim 1 wherein the nano array mask defining at least one box aperture having a plurality of bow tie apertures along at least one inside edge of the at least one box aperture.

8. Wherein the nano-metallic-planar-apex optical detector of claim wherein the nano array mask defining at least one box aperture haying a plurality of isosceles triangular inserts remaining along at least one inside edge of the at least one box aperture.

9. Wherein the nano-metallic-planar-apex optical detector of claim 1 wherein the nano array mask defining at least one box aperture having triangular metal remaining along at least one inside edge of the at least one box aperture.

10. A nano-metallic-planar-apex optical detector, comprising:
    a nano array mask defining a plurality of polygonal apertures that form a plurality of Schottky contact electrodes;
    a semiconductor optical detector, having a semiconductor optical detector first side connected to the plurality of Schottky contact electrodes wherein the semiconductor optical detector detects near-field light focused by the array, the semiconductor optical detector having a semiconductor optical detector second side opposite the semiconductor optical detector first side; and
    a plurality of ohmic contact electrodes aligned with the nano array and connected to the semiconductor optical detector second side.

11. Wherein the nano-metallic-planar-apex optical detector of claim 10 wherein the nano array mask defining at least one box aperture having at least one isosceles triangular insert remaining along at least one inside edge of the at least one box aperture.

12. Wherein the nano-metallic-planar-apex optical detector of claim 10 wherein the nano array mask defining at least one isotoxal square star aperture.

13. Wherein the nano-metallic-planar-apex optical detector of claim 10 wherein the nano array mask defining at least one box aperture having at least one rhombus insert remaining within the at least one box aperture.

14. Wherein the nano-metallic-planar-apex optical detector of claim 10 wherein the nano array mask defining at least one box aperture having a plurality of rhombus inserts remaining within the at least one box aperture.

15. Wherein the nano-metallic-planar-apex optical detector of claim 10 wherein the nano array mask defining at least one box aperture having at least one bow tie aperture along at least one of inside edge of the at least one box aperture.

16. Wherein the nano-metallic-planar-apex optical detector of claim 10 wherein the nano array mask defining at least one box aperture having a plurality of bow tie apertures along at least one inside edge of the at least one box aperture.

17. Wherein the nano-metallic-planar-apex optical detector of claim 10 wherein the nano array mask defining at least one box aperture having a plurality of isosceles triangular inserts remaining along at least inside edge of the at least one box aperture.

18. Wherein the nano-metallic-planar-apex optical detector of claim 10 wherein the nano array mask defining at least one box aperture having triangular metal remaining along at least one inside edge of the at least one box aperture.

19. Wherein the nano-metallic-planar-apex optical detector of claim 10 wherein the nano array mask comprises a cadmium adhesion layer and a gold layer.

\* \* \* \* \*